US012772630B2

(12) United States Patent
Matsunaga et al.

(10) Patent No.: US 12,772,630 B2
(45) Date of Patent: Oct. 20, 2026

(54) OPTICAL WAVEGUIDE PACKAGE AND LIGHT-EMITTING DEVICE

(71) Applicant: KYOCERA Corporation, Kyoto (JP)

(72) Inventors: Shougo Matsunaga, Kirishima (JP); Yoshiaki Itakura, Aira (JP); Hiroshi Matsumoto, Kirishima (JP)

(73) Assignee: KYOCERA CORPORATION, Kyoto (JP)

( * ) Notice: Subject to any disclaimer, the term of this patent is extended or adjusted under 35 U.S.C. 154(b) by 403 days.

(21) Appl. No.: 18/688,399

(22) PCT Filed: Sep. 1, 2022

(86) PCT No.: PCT/JP2022/032950

§ 371 (c)(1),
(2) Date: Mar. 1, 2024

(87) PCT Pub. No.: WO2023/033107

PCT Pub. Date: Mar. 9, 2023

(65) Prior Publication Data

US 2025/0023001 A1 Jan. 16, 2025

(30) Foreign Application Priority Data

Sep. 1, 2021 (JP) ................................ 2021-142758

(51) Int. Cl.

| | |
|---|---|
| ***H10H 20/855*** | (2025.01) |
| ***G02B 6/12*** | (2006.01) |
| ***H10H 20/857*** | (2025.01) |
| *F21Y 113/13* | (2016.01) |
| *H10W 90/00* | (2026.01) |

(52) U.S. Cl.
CPC ............ *H10H 20/855* (2025.01); *G02B 6/12* (2013.01); *H10H 20/857* (2025.01); *F21Y 2113/13* (2016.08); *G02B 2006/12102* (2013.01); *H10W 90/00* (2026.01)

(58) Field of Classification Search
CPC ........ H04B 10/69; H10H 20/855; G02F 1/025
See application file for complete search history.

(56) References Cited

U.S. PATENT DOCUMENTS

2006/0056780 A1 3/2006 Takai et al.
2022/0342140 A1 10/2022 Itakura
2022/0390689 A1 * 12/2022 Itakura .................. G02B 6/424

FOREIGN PATENT DOCUMENTS

JP 10-308555 A 11/1998
JP 2018-049875 3/2018
WO 2021/065948 A1 4/2021
WO 2021065949 A1 4/2021

* cited by examiner

*Primary Examiner* — Yu-Hsi D Sun
(74) *Attorney, Agent, or Firm* — Volpe Koenig

(57) ABSTRACT

An optical waveguide package includes a substrate including a first surface, a cladding on the first surface and including a second surface facing the first surface, a third surface opposite to the second surface, and an element mount with an opening in the third surface, a core in the cladding, a first electrode located in the element mount, and a second electrode connected to the first electrode and extending to outside the element mount. A light-emitting element is mountable on the first electrode. The first electrode has a lower thermal expansion coefficient than the second electrode.

5 Claims, 4 Drawing Sheets

OPTICAL WAVEGUIDE PACKAGE AND LIGHT-EMITTING DEVICE

TECHNICAL FIELD

The present disclosure relates to an optical waveguide package and a light-emitting device.

BACKGROUND OF INVENTION

A known optical waveguide package and a known light-emitting device are described in, for example, Patent Literature 1.

CITATION LIST

Patent Literature

Patent Literature 1: Japanese Unexamined Patent Application Publication No. 10-308555

SUMMARY

In an aspect of the present disclosure, an optical waveguide package includes a substrate including a first surface, a cladding on the first surface and including a second surface facing the first surface, a third surface opposite to the second surface, and an element mount with an opening in the third surface, a core in the cladding, a first electrode located in the element mount, and a second electrode connected to the first electrode and extending to outside the element mount. A light-emitting element is mountable on the first electrode. The first electrode has a lower thermal expansion coefficient than the second electrode.

In another aspect of the present disclosure, a light-emitting device includes the optical waveguide package, a light-emitting element in the element mount, and a lens on an optical path of light to be emitted through the core.

BRIEF DESCRIPTION OF THE DRAWINGS

The objects, features, and advantages of the present disclosure will become more apparent from the following detailed description and the drawings.

DESCRIPTION OF EMBODIMENTS

An optical waveguide package and a light-emitting device with the structure that forms the basis of an optical waveguide package and a light-emitting device according to one or more embodiments of the present disclosure will be described first.

Patent Literature 1 describes a hybrid waveguide optical circuit having a recessed cutout in a cladding on a substrate to receive an optical element. The cutout is covered airtightly with a sealing lid. The optical element in the cutout is electrically connected to, with bonding wires, electrical wiring for external connection located on the cladding surface.

With such a connection using bonding wires as described in Patent Literature 1, the light-emitting element in the element mount is at least at a predetermined distance from the electrical wiring. Such an optical waveguide package thus cannot be smaller. The electrode connected to the light-emitting element in the element mount may be extended between the substrate and the cladding to outside the element mount. This eliminates the bonding wires and allows size reduction.

The light-emitting element generates heat, which transfers through the electrode. The electrode has a temperature difference between a portion near the light-emitting element and a portion outside the element mount, and thus have different thermal expansions, causing deformation of the substrate or the cladding. This deformation can cause misalignment of the optical axis of the light-emitting element or separation of the cladding from the substrate, possibly degrading the characteristics and the reliability.

Figure 1:
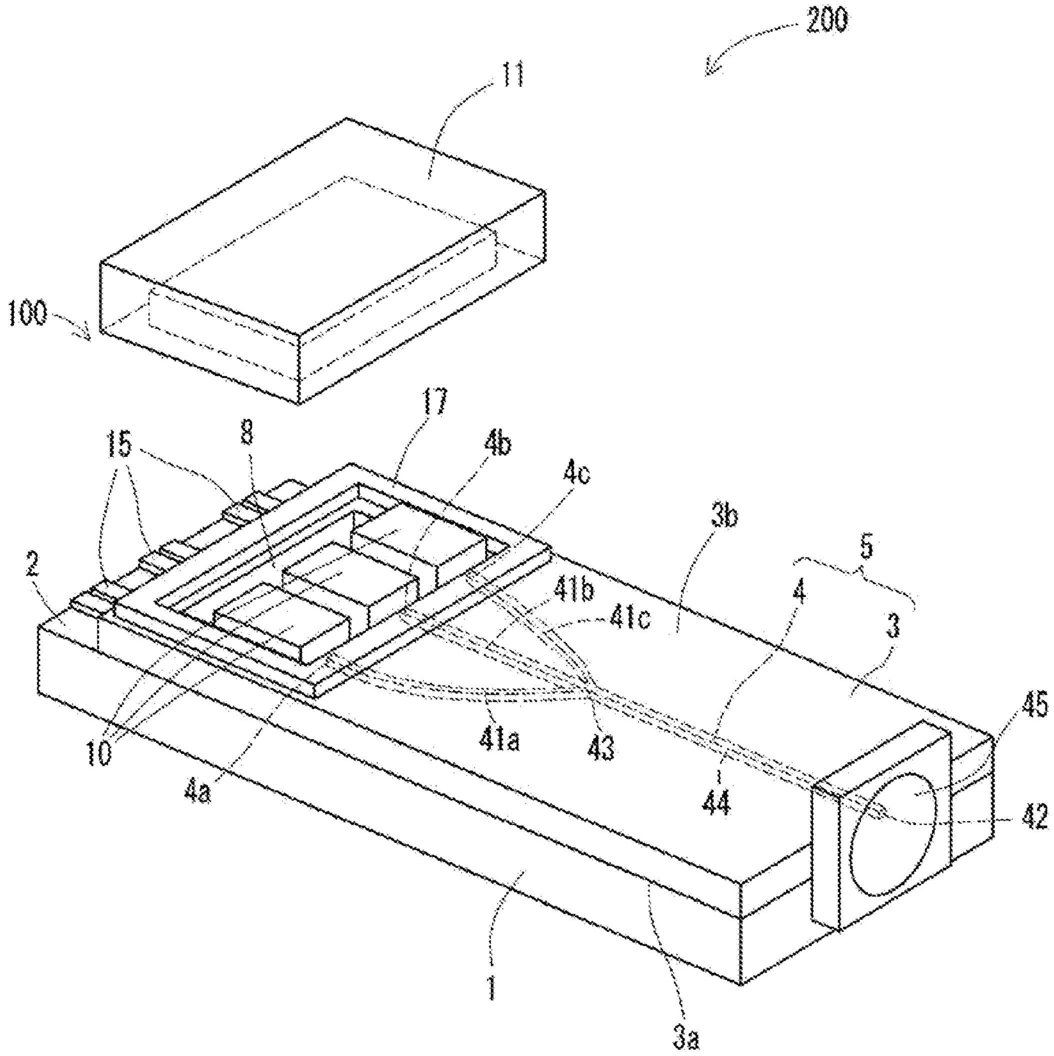
FIG. 1 is an exploded perspective view of a light-emitting device according to a first embodiment.
Figure 2:
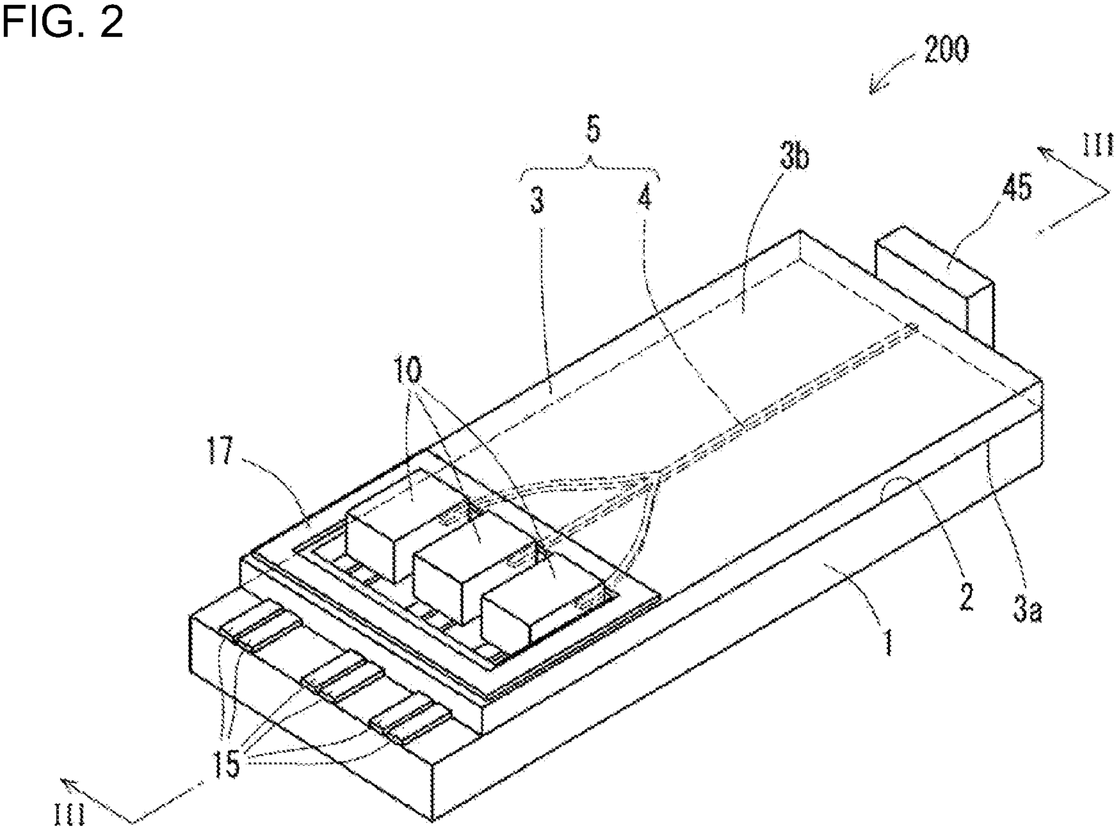
FIG. 2 is a perspective view of the light-emitting device without a lid.
Figure 3:
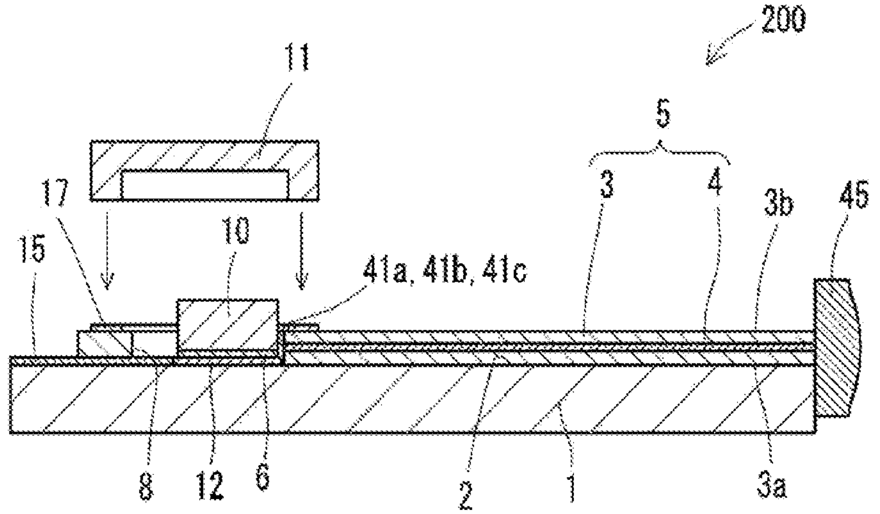
FIG. 3 is a cross-sectional view of the light-emitting device taken along line III-III in FIG. 2.
Figure 4:
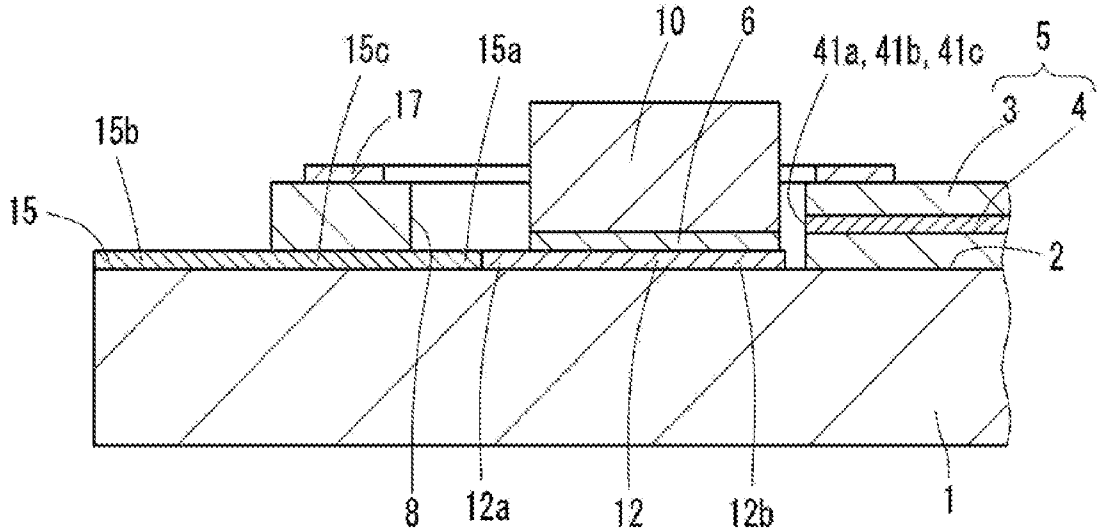
FIG. 4 is an enlarged cross-sectional view of a light-emitting element and its adjacent area.

The optical waveguide package and the light-emitting device according to one or more embodiments of the present disclosure will now be described with reference to the accompanying drawings. FIG. 1 is an exploded perspective view of a light-emitting device according to a first embodiment. FIG. 2 is a perspective view of the light-emitting device without a lid. FIG. 3 is a cross-sectional view of the light-emitting device taken along line III-III in FIG. 2. FIG. 4 is an enlarged cross-sectional view of a light-emitting element and its adjacent area.

A light-emitting device 200 according to the first embodiment includes an optical waveguide package 100, light-emitting elements 10 in an element mount 8, and a lens 45 on the optical path of light emitted through a core 4. The optical waveguide package 100 includes a substrate 1 including a first surface 2, a cladding 3 located on the first surface 2 and including a second surface 3*a* facing the first surface 2, a third surface 3*b* opposite to the second surface 3*a*, and the element mount 8 with an opening in the third surface 3*b*, the core 4 located in the cladding 3, first electrodes 12 located in the element mount 8, and second electrodes 15 connected to the first electrodes 12 and extending to outside the element mount 8. The light-emitting elements 10 are mountable on the first electrodes 12. The light-emitting device 200 further includes a lid 11 covering the element mount 8.

In the present embodiment, the light-emitting device 200 includes three light-emitting elements 10 in the element mount 8 of the optical waveguide package 100. Each light-emitting element 10 is, for example, a light-emitting diode (LED) that emits red (R) light, green (G) light, or blue (B) light. The core 4 and the cladding 3 may be integral with each other to be an optical waveguide layer 5.

The substrate 1 may be a ceramic wiring board including dielectric layers made of a ceramic material. Examples of the ceramic material for the ceramic wiring board include sintered aluminum oxide, sintered mullite, sintered silicon carbide, sintered aluminum nitride, and sintered glass ceramic.

The substrate 1 may be an organic wiring board including dielectric layers made of, for example, an organic material. The organic wiring board may be, for example, a printed wiring board, a build-up wiring board, or a flexible wiring board. Examples of the organic material for the organic wiring board include an epoxy resin, a polyimide resin, a polyester resin, an acrylic resin, a phenolic resin, and a fluororesin.

The core 4 and the cladding 3 are included in the optical waveguide layer 5. The optical waveguide layer 5 may be made of, for example, glass such as quartz, or a resin. In the optical waveguide layer 5, both the core 4 and the cladding 3 may be made of glass or a resin. In some embodiments, one of the core 4 or the cladding 3 may be made of glass and the other may be made of a resin. The core 4 and the cladding 3 have different refractive indexes. The core 4 has a higher refractive index than the cladding 3. This difference in refractive index is used to fully reflect light at the interface between the core 4 and the cladding 3. More specifically, a material with a higher refractive index is used to form a path, which is then surrounded by a material with a lower refractive index. This structure confines light in the core 4 with the higher refractive index.

The core 4 includes multiple incident end faces 4*a*, 4*b*, and 4*c* and one emission end face 42. The core 4 includes multiple branching paths 41*a*, 41*b*, and 41*c*, a merging portion 43, and a joined path 44 between the incident end faces 4*a*, 4*b*, and 4*c* and the emission end face 42. The branching paths 41*a*, 41*b*, and 41*c* respectively include the incident end faces 4*a*, 4*b*, and 4*c* at one end. The branching paths 41*a*, 41*b*, and 41*c* merge together at the merging portion 43. The joined path 44 includes the emission end face 42 at one end.

Red (R) light, green (G) light, and blue (B) light emitted from the light-emitting elements 10 enter the respective branching paths 41*a*, 41*b*, and 41*c* through the respective incident end faces 4*a*, 4*b*, and 4*c*, pass through the merging portion 43 and the joined path 44, and are emitted through the emission end face 42. The light-emitting elements 10 are positioned in the element mount 8 with the center of each of the incident end faces 4*a*, 4*b*, and 4*c* of the branching paths 41*a*, 41*b*, and 41*c* aligned with the optical axis of the corresponding light-emitting element 10.

The element mount 8 may be a recess or a through-hole with an opening in the third surface 3*b* of the cladding 3. In the present embodiment, the element mount 8 is a through-hole extending from the third surface 3*b* to the second surface 3*a* of the cladding 3. In a plan view, a bond 17 surrounds the opening of the element mount 8 on the third surface 3*b* of the cladding 3. The bond 17 bonds the lid 11 to the third surface 3*b* of the cladding 3.

The lid 11 may be made of a glass material such as quartz, borosilicate, or sapphire. The bond 17 may be made of any material that can airtightly bond the lid 11 to the cladding 3, such as Au—Sn or Sn—Ag—Cu solder, an Ag or Cu metal nanoparticle paste, or a glass paste.

The lens 45 is located on the optical path of light emitted through the core 4. The lens 45 may collimate or condense the light emitted through the core 4. The lens 45 is, for example, a plano-convex lens with a flat incident surface and a convex emission surface.

The first electrodes 12 and the second electrodes 15 will be described. The first electrodes 12 are located in an exposed portion of the first surface 2 of the substrate 1 facing the element mount 8. The first electrodes 12 are fully located in the element mount 8. The second electrodes 15 extend from inside to outside the element mount 8. The first electrodes 12 have a lower thermal expansion coefficient than the second electrodes 15. The light-emitting elements 10 are mounted on the first electrodes 12. During operation, the first electrodes 12 have higher temperatures than the second electrodes 15 with heat generated by the light-emitting elements 10. The second electrodes 15 are continuous with the first electrodes 12 and receive heat generated by the light-emitting elements 10 through the first electrodes 12. The second electrodes 15 are farther from the light-emitting elements 10 than the first electrodes 12 and dissipate heat in portions outside the element mount 8. The second electrodes 15 thus have lower temperatures than the first electrodes 12.

When the first electrodes 12 and the second electrodes 15 are not separate components and are integral as one electrode extending from the portion in which the light-emitting elements 10 are mounted to outside the element mount 8, such an electrode has the same thermal expansion coefficient throughout. The portion of the electrode in which the light-emitting elements 10 are mounted thus has a higher temperature with a greater thermal expansion whereas the portion outside the element mount 8 has a lower temperature with a less thermal expansion. The difference in thermal expansion deforms the substrate 1 or the cladding 3. In the present embodiment, as described above, the first electrodes 12 that can have higher temperatures have a lower thermal expansion coefficient, and the second electrodes 15 that can have lower temperatures have a higher thermal expansion coefficient. This reduces the difference in thermal expansion between the first electrodes 12 and the second electrodes 15, thus reducing deformation of the substrate 1 and the cladding 3. This reduced deformation reduces degradation in the characteristics and the reliability of the light-emitting device 200. The first electrodes 12 and the second electrodes 15 allow external connection without bonding wires, thus reducing the size of the optical waveguide package 100 and the light-emitting device 200.

The structure in which the first electrodes 12 have a lower thermal expansion coefficient than the second electrodes 15 can reduce deformation of the substrate 1 and the cladding 3 more than the structure in which the first electrodes 12 have the same thermal expansion coefficient as the second electrodes 15. The degree of the difference in thermal expansion coefficient may be determined as appropriate for, for example, heat generated by the light-emitting elements 10 mounted or for the materials of the substrate 1 and the cladding 3. The first electrodes 12 and the second electrodes 15 may be, for example, made of different materials to have different thermal expansion coefficients. In one example, the first electrodes 12 may be made of three layers, or more specifically, layers of titanium (Ti), platinum (Pt), and gold (Au), and the second electrodes 15 may be made of one layer, or more specifically, a layer of aluminum (Al).

Each first electrode 12 includes a first end 12*a* connected to a second electrode 15. Each second electrode 15 includes a second end 15*a* connected to a first electrode 12. Each first electrode 12 includes a third end 12*b* opposite to the first end 12*a*. A light-emitting element 10 is mounted on the third end 12*b*. Each second electrode 15 includes a fourth end 15*b* opposite to the second end 15*a*, and a middle portion 15*c* continuous with the second end 15*a* and the fourth end 15*b*. The middle portion 15*c* of each second electrode 15 extends between the cladding 3 and the first surface 2 of the substrate 1.

In the present embodiment, as illustrated in FIG. 4, the first end 12*a* of each first electrode 12 and the second end 15*a* of the corresponding second electrode 15 are connected with the first end 12*a* and the second end 15*a* abutting against each other. An element bond 6 is located between the third end 12*b* of each first electrode 12 and the corresponding light-emitting element 10. Although the light-emitting elements 10 may be bonded directly to the first electrodes 12, the bonding strength is increased when the device bond 6 is used. The element bond 6 may be, for example, an Au—Sn (gold-tin) alloy.

Figure 5:
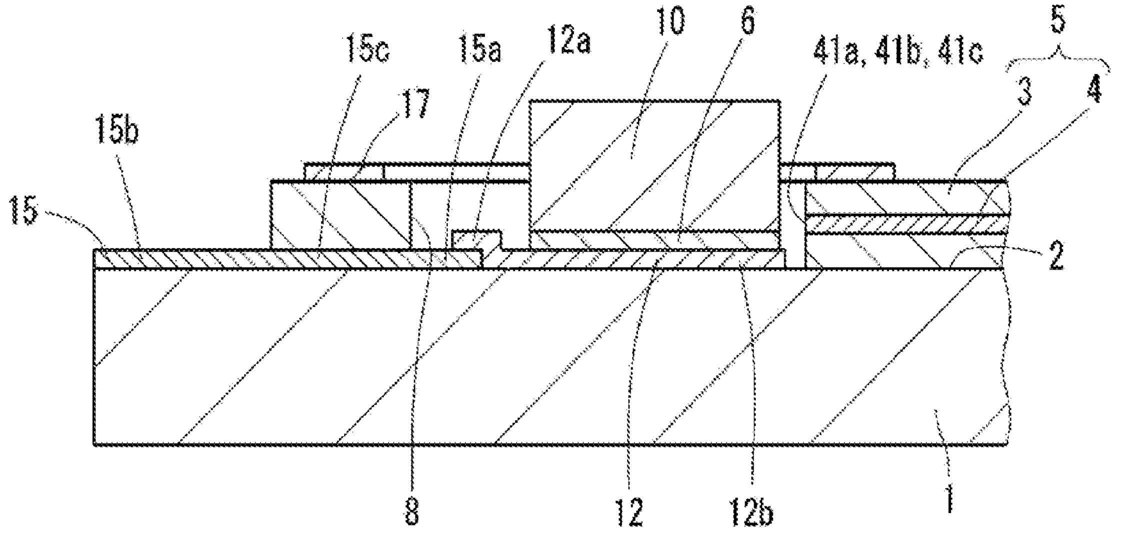
FIG. 5 is an enlarged cross-sectional view of a light-emitting element and its adjacent area in a light-emitting device according to a second embodiment.

FIG. 5 is an enlarged cross-sectional view of a light-emitting element and its adjacent area in a light-emitting device according to a second embodiment. The second embodiment is the same as the first embodiment except the connection between the first electrodes 12 and the second electrodes 15. The other components will not be described in detail. In the present embodiment, the first end 12*a* of each first electrode 12 covers the second end 15*a* of the corresponding second electrode 15. In the first embodiment, the first electrodes 12 and the second electrodes 15 are connected with their end faces in contact with each other. The contact area is thus the area of the end face. In the second embodiment, the contact area includes a portion of the second end 15*a* covered with the first end 12*a*. The contact area is thus larger with less contact resistance. This improves the connection reliability between the first electrodes 12 and the second electrodes 15.

An example method for forming the element mount 8 will now be described. The method includes forming the second electrodes 15 on the first surface 2 of the substrate 1 and placing the optical waveguide layer 5 including the cladding 3 and the core 4 on the first surface 2 including the second electrodes 15. The portion of the cladding 3 to be the element mount 8 is removed by etching to expose the second electrodes 15 and expose the portions of the first surface 2 in which the first electrodes 12 are to be formed. The first electrodes 12 are formed and connected to the second electrodes 15. The first ends 12*a* of the first electrodes 12 may be formed to cover the second ends 15*a* of the second electrodes 15. The portion of the surface of each second electrode 15 exposed by etching the element mount 8 is etched and roughened. The surface of the second end 15*a* of each second electrode 15 is also roughened, with improved adhesion with the first end 12*a* covering the second end 15*a*. The element mount 8 may be formed with any method other than the above method. For example, the substrate 1 on which the second electrodes 15 are formed and the optical waveguide layer 5 with the element mount 8 may be prepared separately and bonded to each other.

Figure 6:
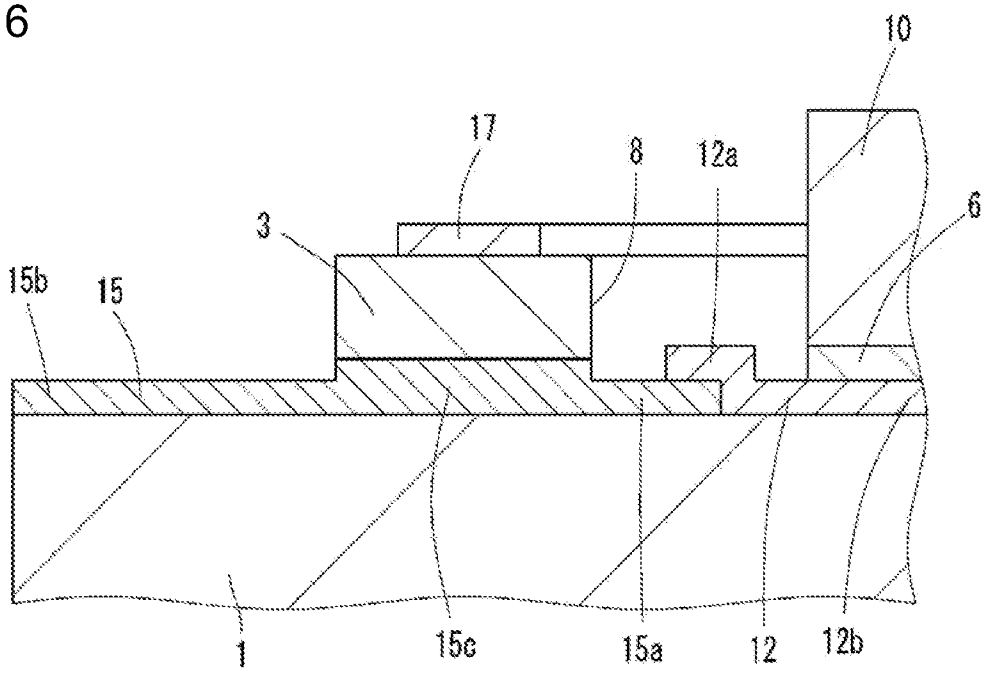
FIG. 6 is an enlarged cross-sectional view of a light-emitting element and its adjacent area in a light-emitting device according to a third embodiment.

FIG. 6 is an enlarged cross-sectional view of a light-emitting element and its adjacent area in a light-emitting device according to a third embodiment. The third embodiment is the same as the second embodiment except the structure of the second electrodes 15. The other components will not be described in detail. Each second electrode 15 in the present embodiment includes a step between the middle portion 15*c* and the second end 15*a*. In other words, the second end 15*a* is thinner than the middle portion 15*c*. The second electrode 15 including the step has a larger surface area than a second electrode 15 including no step, thus increasing heat dissipation from the surface of the second electrode 15. This improves the efficiency of cooling the light-emitting elements 10 and extends the service lives of the light-emitting elements 10. Each second electrode 15 may further include a step between the middle portion 15*c* and the fourth end 15*b*. The second electrode 15 in this structure has a larger surface area than a second electrode 15 including no step, thus increasing heat dissipation from the surface of the second electrode 15. The increased heat dissipation from the surface of each second electrode 15 lowers the temperature of the second electrode 15 and also the temperature of the corresponding first electrode 12. This also reduces deformation resulting from thermal expansion, thus extending the service life.

As described above, the element mount 8 may be formed by etching. An excess amount of etching causes the second ends 15*a* of the second electrodes 15 to be over-etched and thinner. The fourth end 15*b* may be etched in the same or similar manner to form the step nearer the fourth end 15*b*.

Figure 7:
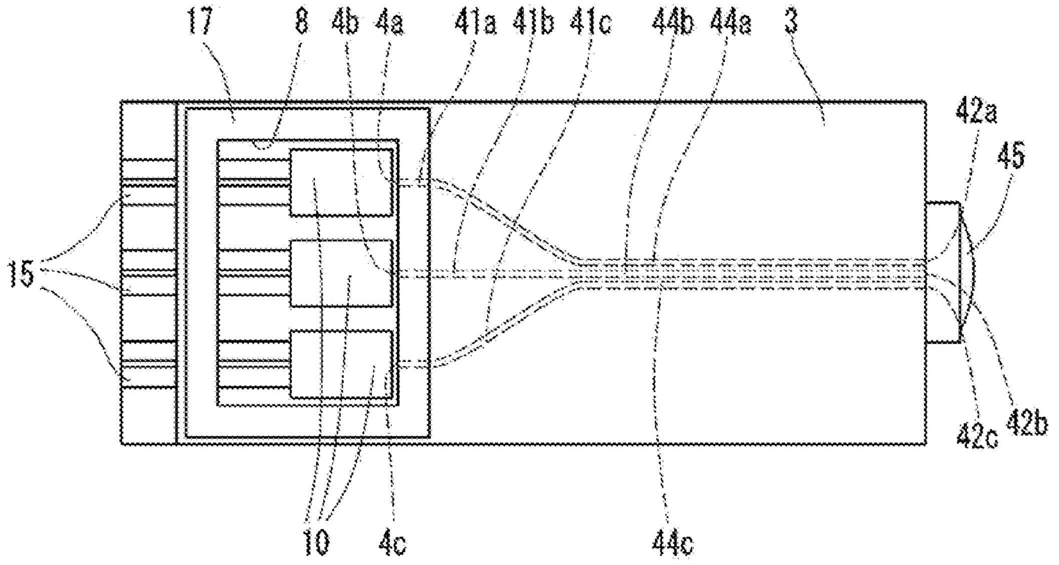
FIG. 7 is a plan view of a light-emitting device according to a fourth embodiment.

FIG. 7 is a plan view of a light-emitting device according to a fourth embodiment. In the first to third embodiments, the core 4 includes three branching paths 41*a*, 41*b*, and 41*c* merged at the merging portion 43 to be the single joined path 44 including the single emission end face 42. The light-emitting device including an optical waveguide package according to the fourth embodiment may include three independent cores 44*a*, 44*b*, and 44*c* as in the plan view in FIG. 7. As in the above embodiments, the incident end faces 4*a*, 4*b*, and 4*c* of the three cores 44*a*, 44*b*, and 44*c* each have the center aligned with the optical axis of the corresponding light-emitting element 10. The three incident end faces 4*a*, 4*b*, and 4*c* are thus located apart from one another to align with the respective light-emitting elements 10. The three cores 44*a*, 44*b*, and 44*c* in the present embodiment include emission end faces 42*a*, 42*b*, and 42*c* located adjacent to one another. The three cores 44*a*, 44*b*, and 44*c* may be gathered adjacent to one another between the incident end faces 4*a*, 4*b*, and 4*c* and the emission end faces 42*a*, 42*b*, and 42*c*, and extend parallel to one another to the emission end faces 42*a*, 42*b*, and 42*c*. Light beams emitted through the cores 44*a*, 44*b*, and 44*c* may be emitted parallel to one another through, for example, the single lens 45. In this case, for example, the images resulting from the light beams emitted from the three emission end faces 42*a*, 42*b*, and 42*c* may be combined using, for example, an external device.

The optical waveguide package according to one or more embodiments of the present disclosure may be implemented in forms (1) to (4) below.

(1) An optical waveguide package, comprising:
- a substrate including a first surface;
- a cladding on the first surface, the cladding including a second surface facing the first surface, a third surface opposite to the second surface, and an element mount with an opening in the third surface;
- a core in the cladding;
- a first electrode on which a light-emitting element is mountable, the first electrode being located in the element mount; and
- a second electrode connected to the first electrode and extending to outside the element mount,
- wherein the first electrode has a lower thermal expansion coefficient than the second electrode.

(2) The optical waveguide package according to (1), wherein
- the first electrode includes a first end connected to the second electrode,
- the second electrode includes a second end connected to the first electrode, and
- the first end covers the second end.

(3) The optical waveguide package according to (1) or (2), wherein the second end includes an etched surface.

(4) The optical waveguide package according to any one of (1) to (3), wherein
- the second electrode includes a step between a middle portion and the second end, and the middle portion is continuous with the second end and located between the cladding and the first surface.

The light-emitting device according to one or more embodiments of the present disclosure may be implemented in form (5) below.

(5) A light-emitting device, comprising:
- the optical waveguide package according to any one of (1) to (4);
- a light-emitting element in the element mount; and
- a lens on an optical path of light to be emitted through the core.

The optical waveguide package and the light-emitting device according to one or more embodiments of the present disclosure can be smaller and have reduced degradation in the characteristics and the reliability.

The light-emitting elements 10 are not limited to light-emitting diodes (LEDs), and may be, for example, laser diodes (LDs) or vertical-cavity surface-emitting lasers (VCSELs).

Although the embodiments of the present disclosure have been described in detail, the present disclosure is not limited to the embodiments described above, and may be changed or varied in various manners without departing from the spirit and scope of the present disclosure. The components described in the above embodiments may be entirely or partially combined as appropriate unless any contradiction arises.

REFERENCE SIGNS

1 substrate
2 first surface
3 cladding
3*a* second surface
3*b* third surface
4; 44*a*, 44*b*, 44*c* core
4*a*, 4*b*, 4*c* incident end face
5 optical waveguide layer
6 element bond
8 element mount
10 light-emitting element
11 lid
12 first electrode
12*a* first end
12*b* third end
15 second electrode
15*a* second end
15*b* fourth end
15*c* middle portion
17 bond
41*a*, 41*b*, 41*c* branching path
42; 42*a*, 42*b*, 42*c* emission end face
43 merging portion
44 joined path
45 lens
100 optical waveguide package
200 light-emitting device

The invention claimed is:

1. An optical waveguide package, comprising:
- a substrate including a first surface;
- a cladding on the first surface, the cladding including a second surface facing the first surface, a third surface opposite to the second surface, and an element mount with an opening in the third surface;
- a core in the cladding;
- a first electrode on which a light-emitting element is mountable, the first electrode being located in the element mount; and
- a second electrode connected to the first electrode and extending to outside the element mount,
- wherein the first electrode has a lower thermal expansion coefficient than the second electrode.

2. The optical waveguide package according to claim 1, wherein
- the first electrode includes a first end connected to the second electrode,
- the second electrode includes a second end connected to the first electrode, and
- the first end covers the second end.

3. The optical waveguide package according to claim 2, wherein
- the second end includes an etched surface.

4. The optical waveguide package according to claim 2, wherein
- the second electrode includes a step between a middle portion and the second end, and the middle portion is continuous with the second end and located between the cladding and the first surface.

5. A light-emitting device, comprising:
- the optical waveguide package according to claim 1;
- a light-emitting element in the element mount; and a lens on an optical path of light to be emitted through the core.

* * * * *